US012488981B2

(12) United States Patent
Khaja et al.

(10) Patent No.: US 12,488,981 B2
(45) Date of Patent: Dec. 2, 2025

(54) SYSTEMS AND METHODS FOR DEPOSITION RESIDUE CONTROL

(71) Applicant: Applied Materials, Inc., Santa Clara, CA (US)

(72) Inventors: Abdul Aziz Khaja, San Jose, CA (US); Anjana M. Patel, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1011 days.

(21) Appl. No.: 17/104,387

(22) Filed: Nov. 25, 2020

(65) Prior Publication Data

US 2022/0165567 A1  May 26, 2022

(51) Int. Cl.
*H01L 21/00* (2006.01)
*H01J 37/32* (2006.01)
*H01L 21/02* (2006.01)
*H01L 21/67* (2006.01)

(52) U.S. Cl.
CPC .. *H01L 21/02274* (2013.01); *H01J 37/32091* (2013.01); *H01J 37/32633* (2013.01); *H01L 21/67017* (2013.01)

(58) Field of Classification Search
None
See application file for complete search history.

(56) References Cited

U.S. PATENT DOCUMENTS 4,844,773 A    7/1989  Loewenstein et al.
5,622,565 A *  4/1997  Ye .................... C23C 14/564
                                                118/723 R
2004/0045577 A1    3/2004  Ji et al.
2005/0150452 A1*   7/2005  Sen .................... C23C 16/4412
                                                118/715
2012/0231631 A1    9/2012  Kim
2015/0194326 A1    7/2015  Zhou et al.
(Continued)

FOREIGN PATENT DOCUMENTS

TW    200525595 A    8/2005
TW    201111050 A    4/2011
(Continued)

OTHER PUBLICATIONS

International Search Report and Written Opinion mailed Mar. 8, 2022 in International Patent Application No. PCT/US2021/059692, 9 pages.

(Continued)

*Primary Examiner* — Parviz Hassanzadeh
*Assistant Examiner* — Michelle Crowell
(74) *Attorney, Agent, or Firm* — Kilpatrick Townsend & Stockton LLP

(57) ABSTRACT

Exemplary semiconductor processing systems may include a chamber body comprising sidewalls and a base. The systems may include a substrate support extending through the base of the chamber body. The substrate support may include a support platen and a stem. The systems may include a baffle extending about a stem of the substrate support. The baffle may define one or more apertures through the baffle. The systems may include a fluid source fluidly coupled with the chamber body at an access between the stem of the substrate support and the baffle.

7 Claims, 4 Drawing Sheets

(56) References Cited

U.S. PATENT DOCUMENTS

2015/0376780 A1* 12/2015 Khaja ............... H01L 21/67103
  134/1.1
2019/0341277 A1* 11/2019 Yoo .................... H01L 21/0274
2020/0024735 A1   1/2020 Wu et al.
2022/0130650 A1*  4/2022 Bobek ............... C23C 16/45521

FOREIGN PATENT DOCUMENTS

| TW | 201527586 A | 7/2015 |
| TW | 202030828 A | 8/2020 |
| WO | 2020210031 A1 | 10/2020 |

OTHER PUBLICATIONS

Application No. JP2023-530520, Notice of Decision to Grant, mailed on Jul. 1, 2025, 5 pages.

* cited by examiner

SYSTEMS AND METHODS FOR DEPOSITION RESIDUE CONTROL

TECHNICAL FIELD

The present technology relates to systems and methods for semiconductor processing. More specifically, the present technology relates to processing chamber components and methods for controlling deposition residue during processing.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process. Additionally, the components within the chamber may impact deposition on chamber components or edge and backside regions of a substrate support.

Thus, there is a need for improved systems and methods that can be used to produce high quality devices and structures. These and other needs are addressed by the present technology.

SUMMARY

Exemplary semiconductor processing systems may include a chamber body comprising sidewalls and a base. The systems may include a substrate support extending through the base of the chamber body. The substrate support may include a support platen and a stem. The systems may include a baffle extending about a stem of the substrate support. The baffle may define one or more apertures through the baffle. The systems may include a fluid source fluidly coupled with the chamber body at an access between the stem of the substrate support and the baffle.

In some embodiments, the systems may include a pumping plate extending about the substrate support and forming a plenum between the pumping plate and the base of the chamber body. The systems may include an RF rod extending through the stem of the substrate support. The RF rod may be coupled with electrical ground or an RF power supply. The baffle may include a conductive covering extending along the stem of the substrate support. The base of the chamber body may define an access for a pumping system foreline. The base of the chamber body may include a fluorine-containing coating.

Some embodiments of the present technology may encompass methods of semiconductor processing. The methods may include forming a plasma of a deposition precursor in a processing region of a semiconductor processing chamber. The methods may include flowing a purge gas through a gap defined between a substrate support and a baffle extending about a stem of the substrate support. The methods may include generating plasma effluents of the purge gas between the stem of the substrate support and the baffle. The methods may include depositing material on a substrate seated on the substrate support. The methods may include exhausting deposition byproducts from the processing region. The methods may include flowing the plasma effluents of the purge gas through apertures defined in the baffle while exhausting the deposition byproducts from the processing region of the semiconductor processing chamber.

In some embodiments, the baffle may be or include a conductive covering extending along the stem of the substrate support. The substrate support may include an RF rod extending through the stem of the substrate support. The plasma of the deposition precursor may be a capacitively-coupled plasma formed within the processing region of the semiconductor processing chamber. The plasma effluents of the purge gas may be generated by emissions from the RF rod. The methods may include removing deposited material from a surface of the semiconductor processing chamber with the plasma effluents of the purge gas. The semiconductor processing chamber may include a chamber body including sidewalls and a base. The base of the chamber body may define an access for a pumping system foreline. The chamber may include a pumping plate extending about the substrate support and forming a plenum between the pumping plate and the base of the chamber body. The base of the chamber body may include a fluorine-containing coating. The plasma effluents of the purge gas may be flowed into the plenum formed between the pumping plate and the chamber body. The purge gas may be or include oxygen or nitrogen trifluoride.

Some embodiments of the present technology may encompass methods of semiconductor processing. The methods may include forming a plasma of a deposition precursor in a processing region of a semiconductor processing chamber. The methods may include flowing a purge gas through a gap defined between a substrate support and a baffle extending about a stem of the substrate support. The methods may include depositing material on a substrate seated on the substrate support. The methods may include exhausting deposition byproducts from the processing region. The methods may include flowing the purge gas through apertures defined in the baffle while exhausting the deposition byproducts from the processing region of the semiconductor processing chamber.

In some embodiments, the purge gas may react with the deposition byproducts to produce volatile materials. The semiconductor processing chamber may include a chamber body including sidewalls and a base. The base of the chamber body may define an access for a pumping system foreline. The chamber may include a pumping plate extending about the substrate support and forming a plenum between the pumping plate and the base of the chamber body. The apertures defined through the baffle may be formed at a location between the pumping plate and a platen of the substrate support.

Such technology may provide numerous benefits over conventional systems and techniques. For example, embodiments of the present technology may limit deposition on chamber components such as about a foreline connection and other chamber components. Additionally, by reducing or eliminating deposition within the chamber, throughput may be improved by reducing chamber cleaning operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
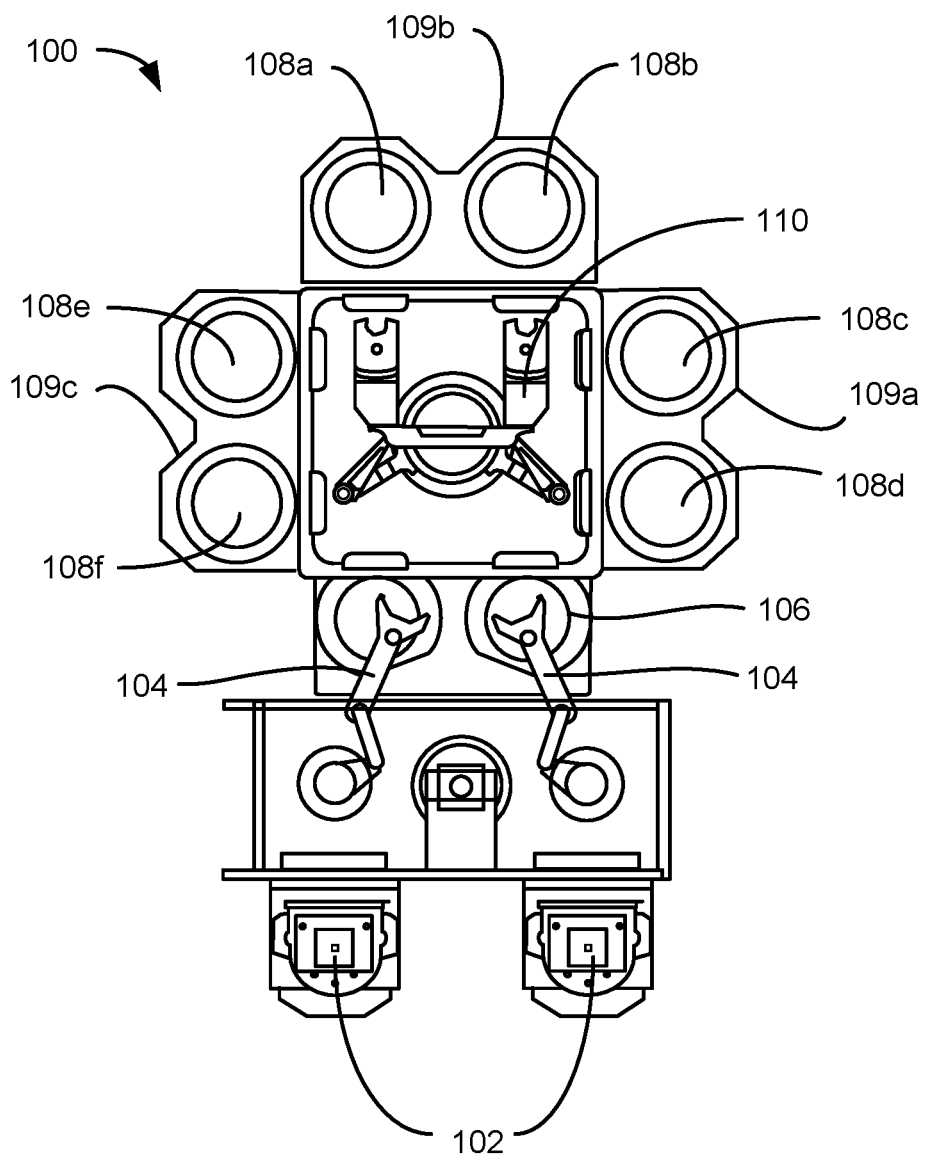
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. Additionally, other dielectric materials may be deposited to separate transistors on a substrate, or otherwise form semiconductor structures. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

While lid stack components may beneficially distribute precursors into a processing region to facilitate uniform deposition, structures and operations to ensure more uniform coverage across the substrate may extend deposition into a number of regions about the chamber. For example, deposition precursors and products may be flowed through an exhaust system coupled at a base of the processing chamber, or at another location about the chamber. However, as many of these components may be maintained at a temperature lower or much lower than the substrate being processed, deposition materials may more readily condense or re-deposit on the chamber body walls or base, where a connection with a pumping system may be formed. To address this issue, conventional technologies may be forced to increase timing for subsequent chamber cleaning processes after deposition. However, such a process may have multiple drawbacks. For example, accessing these regions of the chamber may be more challenging, which may cause increased cleaning times to be needed and may increase queue times, reducing throughput for the system. Additionally, these increased clean times may expose other chamber components to extended interactions with plasma effluents that may corrode the chamber or components more quickly.

The present technology overcomes these challenges by utilizing purge materials to interact with one or more of deposition byproducts, as well as deposited materials within the chamber, during deposition operations. By causing chemical reactions with the effluent deposition materials, and/or utilizing parasitic plasma to generate cleaning radical species, the present technology may limit or prevent deposition on chamber components, or may remove deposited material from chamber surfaces during the deposition operations. By controlling or eliminating material deposited on the chamber surfaces, cleaning operations can be improved by limiting cleaning performed in recessed regions, which may improve throughput.

Although the remaining disclosure will routinely identify specific deposition processes utilizing the disclosed technology, it will be readily understood that the systems and methods are equally applicable to other deposition and cleaning chambers, as well as processes as may occur in the described chambers. For example, many etch processes may produce byproducts that may condense or reform on chamber surfaces, and which may be improved by incorporating one or more aspects of the present technology. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
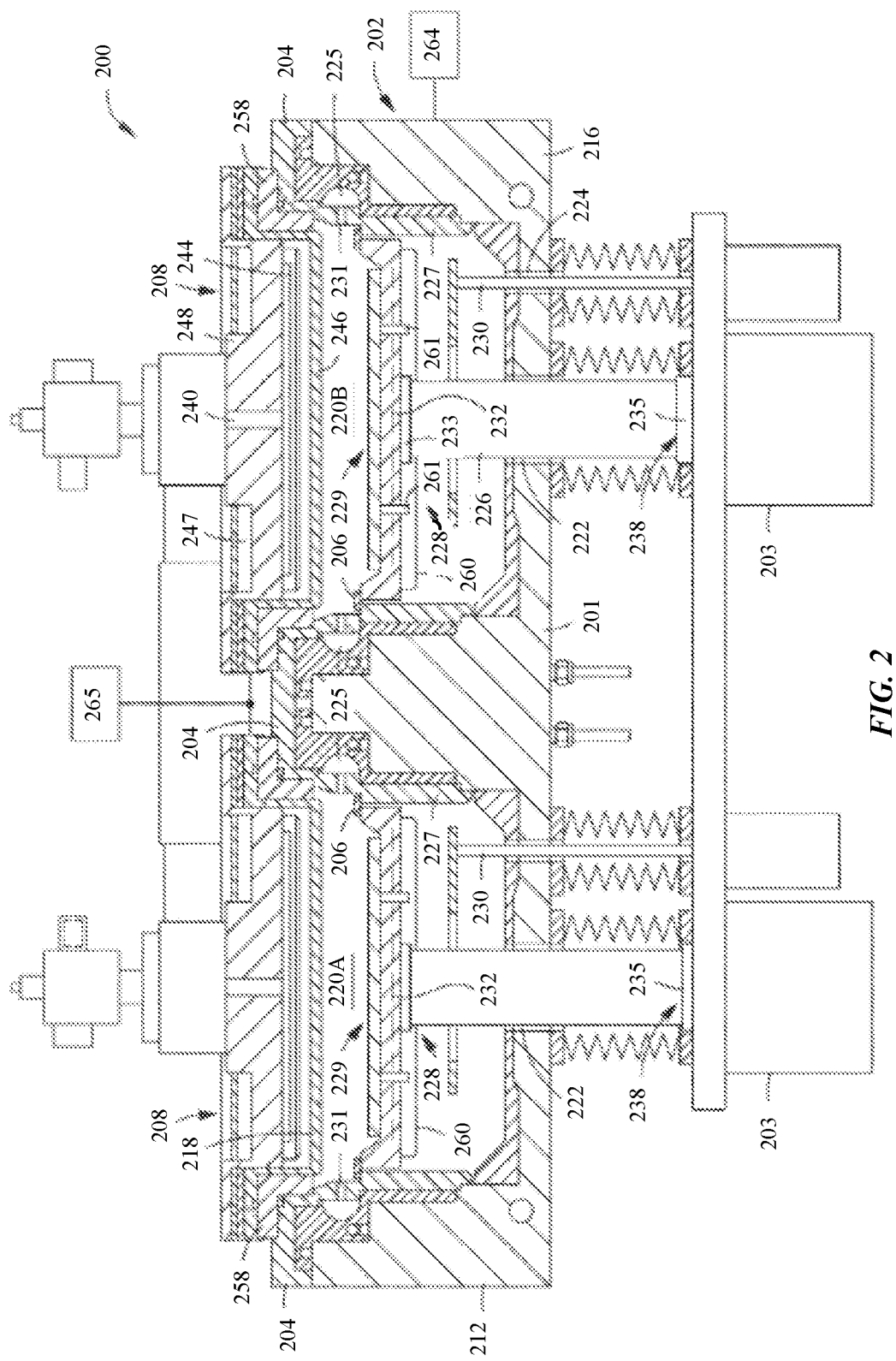
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
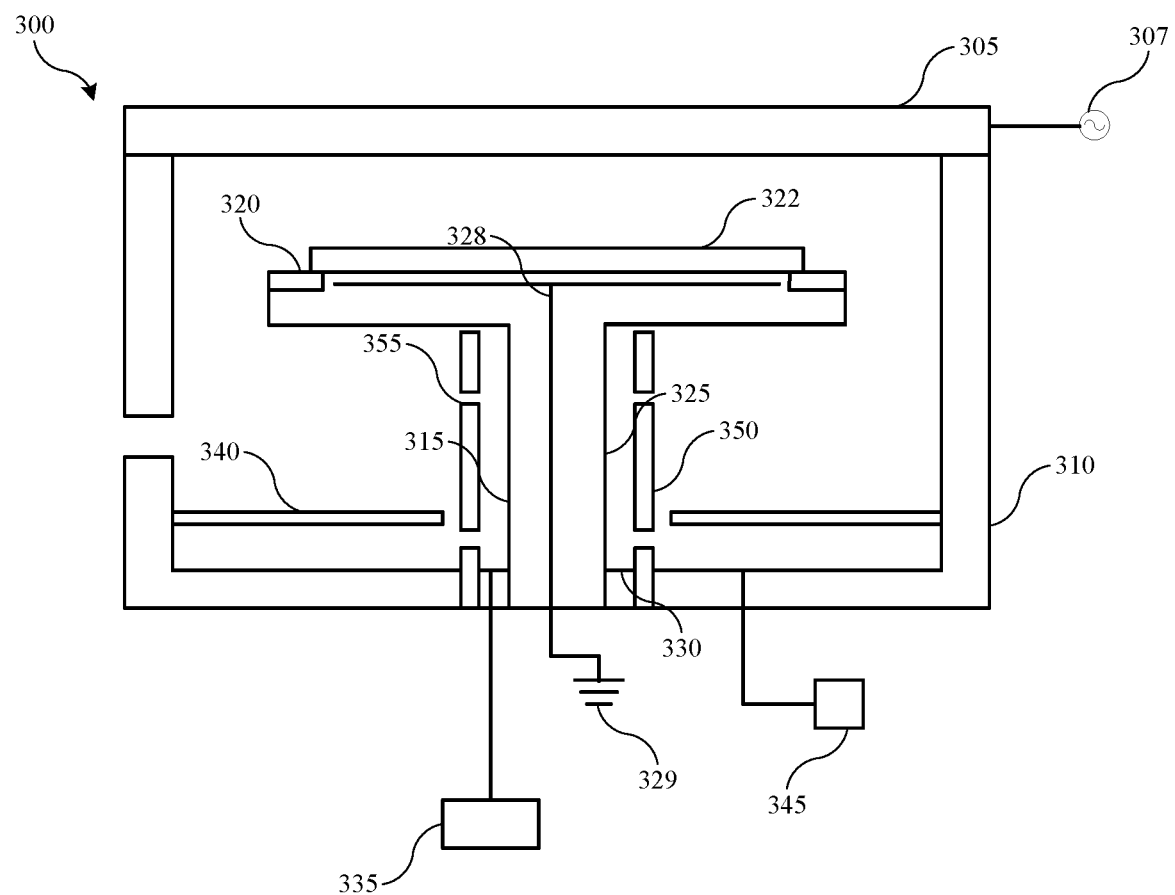
FIG. 3 shows a schematic partial cross-sectional view of an exemplary processing system according to some embodiments of the present technology.

FIG. 3 shows a schematic partial cross-sectional view of an exemplary processing system 300 according to some embodiments of the present technology. FIG. 3 may illustrate further details relating to components in system 200. System 300 is understood to include any feature or aspect of system 200 discussed previously in some embodiments. The system 300 may be used to perform semiconductor processing operations including deposition of hardmask materials or other materials as previously described, as well as other deposition, removal, or cleaning operations. System 300 may show a partial view of the chamber components being discussed and that may be incorporated in a semiconductor processing system, and may illustrate a view without several of the lid stack components noted above. Any aspect of system 300 may also be incorporated with other processing chambers or systems as will be readily understood by the skilled artisan.

System 300 may include a processing chamber including a faceplate 305, through which precursors may be delivered for processing, and which may be coupled with a power source 307 for generating a plasma within the processing region of the chamber. The chamber may also include a chamber body 310, which as illustrated may include sidewalls and a base. A pedestal or substrate support 315 may extend through the base of the chamber as previously discussed. The substrate support may include a support platen 320, which may support semiconductor substrate 322. The support platen 320 may be coupled with a stem 325, which may extend through the base of the chamber. Stem 325 may provide access for a number of fluid and electrical connections, such as couplings for a heater or chuck, for example. As explained above, a conductive rod, such as an RF rod 328 may extend through the stem of the substrate support, and may be coupled with an electrode, or coupled with the substrate support. The rod may be coupled with electrical ground 329 as illustrated, although in some embodiments the power source 307 and electrical ground connections may be reversed, and power may be applied through the substrate support. In either scenario, the two electrodes may operate to produce a capacitively-coupled plasma within the processing region defined between the faceplate and the substrate support.

As illustrated, chamber body 310 may define an access 330 extending circumferentially about the substrate support, and which may be defined by the chamber body and/or with one or more additional components within the chamber. A fluid source 335 may be coupled with the access 330, or a port coupled with the access, and may be configured to deliver one or more purge materials through the access and into a volume defined at least partially about the stem of the substrate support, such as with a baffle 350 discussed further below. Although any inert or noble gas may be flowed through the access, as will be described below, in some embodiments the fluid source may deliver an etchant or diluent species, such as hydrogen, oxygen, a halogen-containing material, or other materials, through the access to facilitate dilution of or reaction with deposition materials, as will be discussed further below.

System 300 may also include additional components that may cooperate to define an exhaust path from the processing chamber. The chamber may include a pumping plate 340, which may define an exhaust plenum with the base of the chamber. The pumping plate 340 may extend about the substrate support stem, and may define an access between the pumping plate and the stem, which may allow process gases to flow into the plenum to be exhausted from the chamber. A pumping system 345 may couple through the base of the chamber for exhausting processing materials, and the system may include a pump, throttle valve, a foreline that may couple with the chamber base, and any other components that may be used in semiconductor chamber exhaust setups.

The chamber may also include a baffle 350 extending about the stem of the substrate support. The baffle may contain a volume defined between the stem of the substrate support and the baffle, and which may receive the purge fluid flowed from fluid source 335. In some embodiments baffle 350 may define one or more apertures 355 through the baffle, which may provide egress for fluids flowed into the volume. The apertures may be included in any location or configuration, which may allow purge materials to be directed to interact with either process fluids as they flow towards the exhaust, as well as to interact with materials deposited on the chamber surfaces. For example, as noted above, because some chamber surfaces may be maintained cooler than a substrate, deposition products and byproducts may be more likely to condense or deposit on these surfaces. To accommodate this material, or prevent the deposition, the present technology may perform a number of operations.

For example, one or more apertures 355 may be formed through the baffle between the base of the chamber and the pumping plate 340, which may direct the purge materials into the exhaust plenum. Additionally or alternatively, one or more apertures 355 may be formed through the baffle between the pumping plate and a backside of the platen of the substrate support, which may allow purge materials to contact chamber surfaces, such as the platen, chamber walls, liners, or slit valves, or interact with flowing effluent materials. In some embodiments the apertures may be formed at an angle or directed towards surfaces. As one non-limiting example, one or more apertures formed through the baffle between the chamber body and the pumping plate 340 may be formed at a downward angle to direct purge materials towards the base of the chamber, which may allow increased interaction and removal with deposited materials. Additionally, apertures may be formed at an angle to interact with particular chamber surfaces, the platen or other aspect of the support, or may be formed to create an amount of flow or rotation about the region defined below the support platen.

As will be explained further below, in some embodiments the purge materials may be flowed in an un-excited state to interact with deposition materials, such as materials that did not react or deposit on the substrate surface or byproducts produced during deposition. Additionally, systems according to some embodiments of the present technology may utilize parasitic plasma to generate cleaning plasma radical species to perform chamber cleaning operations during deposition. As explained above, RF rod 328, or some conductive rod, may extend through the substrate support stem either delivering RF power for plasma generation, or as a return path extending to electrical ground as illustrated. This operation may be in developing a capacitively-coupled plasma between the faceplate and pedestal, which may allow plasma-enhanced deposition to occur. However, the voltage passing through the rod 328 may generate an electrical field extending outward. Semiconductor processing generally seeks to limit production of parasitic plasma, which can alter plasma generation in intended location, current flow, and processing operations. For example, baffle 350 may be formed of a conductive material, which contains the field, like a Faraday cage, and limits parasitic plasma formation in the processing environment.

The present technology may deliver a purge fluid between the stem and the baffle, which may be energized and in some embodiments ionized in this volume. The baffle may be maintained a sufficient distance from the stem to afford generation of radical purge species. By incorporating the apertures through the baffle, the radical species may be delivered into the processing chamber to interact in one or more ways. For example, plasma species may be delivered to interact with flowing deposition products, or in some embodiments the purge materials may include one or more etchant materials, which may perform chamber cleaning during the processing. Additionally, in some embodiments the base of the chamber, as well as one or both sides of the pumping plate may be coated with a fluorine-containing, ceramic, or other material to limit deposition during processing. For example, the chamber surface or components may include a coating of polytetrafluoroethylene or some other material configured to limit deposition of byproducts during processing operations.

Figure 4:
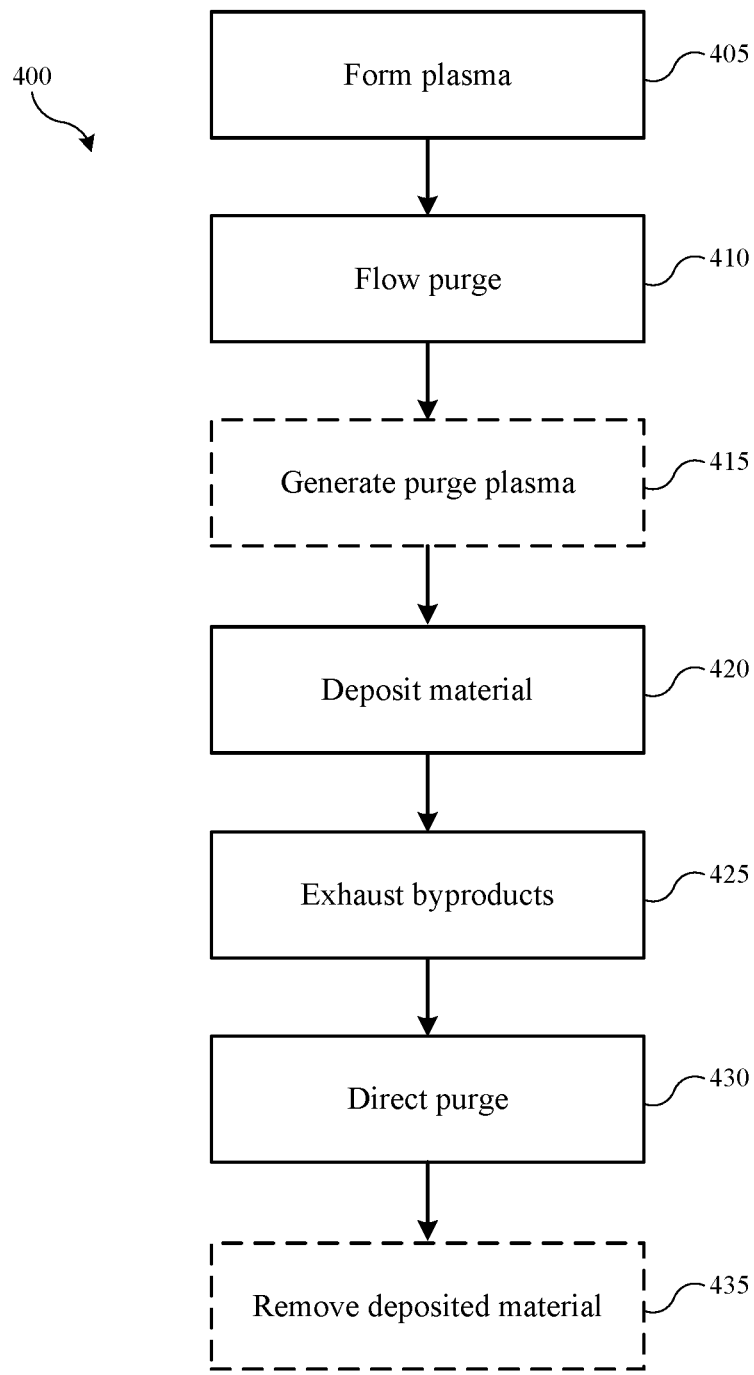
FIG. 4 shows operations of an exemplary method of semiconductor processing according to some embodiments of the present technology.

As explained previously, some embodiments of the present technology may utilize purge and/or cleaning materials that may limit deposition on chamber components outside of a processing region defined between the substrate support and the faceplate, or may remove deposition materials during the deposition operations themselves. FIG. 4 shows operations of an exemplary method 400 of semiconductor processing according to some embodiments of the present technology. The method may be performed in a variety of processing chambers, including processing systems 200 and 300 described above, which may include any features or components defining purge and exhaust paths as previously described. Method 400 may include a number of optional operations, which may or may not be specifically associated with some embodiments of methods according to the present technology. For example, many of the operations are described in order to provide a broader scope of the technology, but are not critical to the technology, or may be performed by alternative methodology as would be readily appreciated. Additionally, the operations may be performed in any order, including a different order than illustrated, including having one or more operations occurring simultaneously. It is to be understood that the operations shown are merely operations that may occur during methods according to some embodiments of the present technology.

Method 400 may include additional operations prior to initiation of the listed operations. For example, semiconductor processing may be performed prior to initiating method 400. Processing operations may be performed in the chamber or system in which method 400 may be performed, or processing may be performed in one or more other processing chambers prior to delivering the substrate into the processing chamber in which method 400 may be performed. Once a substrate has been received in a processing chamber, such as including some or all of components from system 300 described above, method 400 may include forming a plasma of one or more deposition precursors in a processing region of a semiconductor processing chamber at operation 405. The substrate may be positioned on a substrate support, such as support 315 described above, which may include any component, feature, or characteristic described above, including a baffle defining one or more apertures to direct purge fluids as previously described. During the formation, and including during a deposition operation, a purge gas may be flowed into an access through a base of the chamber at operation 410, and which may be flowed into a gap or volume defined between a substrate support and the baffle extending about the stem of the substrate support, for example.

During the deposition, the purge materials may flow or be directed from one or more apertures defined through the baffle. In some embodiments, a purge or cleaning fluid may be delivered to interact with aspects of the deposition material. As one non-limiting example, during formation of a carbon hardmask material, effluent materials may include carbon-and-hydrogen-containing materials that may be radical. Flowing hydrogen and/or oxygen to interact with these materials may allow a reaction to occur based on the energy provided by the radical carbon species. The reaction may produce volatile products, such as hydrocarbons, carbon dioxide, or other materials, which may prevent carbon deposition on surfaces of the chamber.

As another non-limiting example, during deposition of a silicon material, such as utilizing plasma effluents of silane or tetraethyl orthosilicate, the purge materials may include hydrogen or a halogen-containing material, such as fluorine or chlorine containing materials, among other materials, which may produce volatile silicon materials, such as reformed silane, silicon tetrafluoride, or other materials that may limit silicon deposition on chamber components. Accordingly, any material that may combine with the deposition materials, or which may be used as an etchant for cleaning chambers or etching deposition materials may be used. During some embodiments of these processes, one or more apertures may be defined in the baffle to direct materials prior to interaction with chamber surfaces, such as entering the exhaust plenum, and the purge fluids may be delivered in a region between the pumping plate and the substrate support platen, although the materials may alternatively or additionally be delivered to any other location to limit deposition on chamber surfaces.

Additionally, as explained previously, the voltage through the RF rod or another conductive rod may be used to generate plasma effluents of the purge materials at optional operation 415. As explained previously, the plasma of the deposition precursor may be a capacitively-coupled plasma generated between the faceplate and the substrate support. The voltage applied or extending to ground through a rod in the stem may be used to produce parasitic plasma, which may generate plasma effluents of the purge materials. The purge materials may then be directed to one or more locations where deposition may occur, such as within the pumping plenum including along the base of the chamber body. The radical purge materials may etch or remove the materials and exhaust them from the system. For example, oxygen plasma effluents may be directed to locations to remove carbon-containing deposits formed on chamber surfaces during the deposition operations for carbon materials, or fluorine plasma effluents may be directed to locations to remove silicon-containing deposits.

From the plasma effluents of the one or more deposition precursors, a material may be deposited on the substrate at operation 420. Both residual deposition materials and byproducts, as well as purge gas, may be flowed into the exhaust plenum. These materials may then be exhausted from the processing chamber at operation 425. During the deposition, the purge materials may be directed to one or more locations with apertures through the baffle at operation 430. While in some embodiments the purge materials may interact with flowing deposition products and limit or prevent deposition on chamber surfaces, in some embodiments the purge materials may remove deposited materials in optional operation 435, as explained above.

As noted above, any number of purge gases may be flowed through the access and gap in the chamber. For example, any noble gas including helium or argon, as well as hydrogen, nitrogen, oxygen, or materials including one or more of these materials, such as nitrous oxide, halogen-containing materials, or any other material may be flowed as the purge gas. Because some of the purge gases may be characterized by higher ionization energy, which may limit discharge, the deposition plasma may or may not be performed at higher voltage to increase parasitic plasma formation.

Flow of the purge gas may impact aspects of deposition. For example, in one non-limiting example, a carbon hardmask may be deposited on a substrate utilizing processes and equipment according to embodiments of the present technology. In some embodiments the deposition precursors may be limited to a carbon-and-hydrogen-containing precursor, and or one or more carrier gases, although in some embodiments one or more dopant precursors may be included. To facilitate removal or interaction with the precursors, as well as to ensure complete removal of any deposited carbon-materials on the chamber surfaces, a flow rate of oxygen, hydrogen, or other materials, may be greater than or about 500 sccm of flow introduced through the access in the chamber, and the flow rate may be greater than or about 1000 sccm, greater than or about 1500 sccm, greater than or about 2000 sccm, greater than or about 2500 sccm, greater than or about 3000 sccm, greater than or about 3500 sccm, greater than or about 4000 sccm, greater than or about 4500 sccm, greater than or about 5000 sccm, or higher. Additionally, if a nitrogen-and-oxygen-containing material is used, such as nitrous oxide, the flow rate may be doubled to provide sufficient oxygen for the removal. Similar flow rates of other materials discussed above may be utilized for interaction with other deposition materials, such as fluorine-containing materials that may be provided in some embodiments of silicon-containing depositions.

To further increase removal of materials that may have deposited, the chamber base may be increased compared to conventional processing. For example, the chamber base may be heated to greater than or about 100° C., and may be heated to greater than or about 110° C., greater than or about 120° C., greater than or about 130° C., greater than or about 140° C., greater than or about 150° C., greater than or about 160° C., greater than or about 170° C., greater than or about 180° C., greater than or about 190° C., greater than or about 200° C., or higher. Any other component of the pumping system may similarly be heated to limit deposition, and any of the components may be coated to limit deposition as previously described. By incorporating embodiments of the present technology, deposition on chamber surfaces may be limited or prevented in some embodiments. Consequently, improved throughput may be afforded due to reduced cleaning times.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the fluid" includes reference to one or more fluids and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:
   a chamber body comprising sidewalls and a base;
   a substrate support extending through the base of the chamber body, wherein the substrate support comprises a support platen and a stem;
   a baffle extending about a stem of the substrate support, wherein:
   a sidewall of the baffle extends vertically from the base of the chamber body along a length of the stem;
   the baffle defines one or more apertures through the baffle; and
   at least some apertures of the one or more apertures extend through a lateral surface of the sidewall of the baffle and are angled toward a surface of the base of the chamber body; and
   a fluid source fluidly coupled with the chamber body at an access between the stem of the substrate support and the baffle.

2. The semiconductor processing system of claim 1, further comprising:
   a pumping plate extending about the substrate support and forming a plenum between the pumping plate and the base of the chamber body.

3. The semiconductor processing system of claim 1, further comprising:
   an RF rod extending through the stem of the substrate support.

4. The semiconductor processing system of claim 3, wherein the RF rod is coupled with electrical ground or an RF power supply.

5. The semiconductor processing system of claim 1, wherein the baffle comprises a conductive covering extending along the stem of the substrate support.

6. The semiconductor processing system of claim 1, wherein the base of the chamber body defines an access for a pumping system foreline.

7. The semiconductor processing system of claim 6, wherein the base of the chamber body comprises a fluorine-containing coating.

* * * * *